United States Patent
Tanaka

(10) Patent No.: US 8,493,481 B2
(45) Date of Patent: Jul. 23, 2013

(54) SOLID-STATE IMAGING DEVICE, MANUFACTURING METHOD FOR SOLID-STATE IMAGING DEVICE, AND IMAGING APPARATUS

(75) Inventor: Shunsuke Tanaka, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 350 days.

(21) Appl. No.: 12/874,056

(22) Filed: Sep. 1, 2010

(65) Prior Publication Data

US 2011/0063467 A1 Mar. 17, 2011

(30) Foreign Application Priority Data

Sep. 17, 2009 (JP) ................ P2009-215607

(51) Int. Cl.
*H04N 9/083* (2006.01)
*H04N 3/14* (2006.01)
*H04N 5/335* (2011.01)
*H04N 9/04* (2006.01)

(52) U.S. Cl.
USPC ..... 348/273; 348/374; 257/440; 257/E31.121

(58) Field of Classification Search
USPC .................. 348/273, 374; 257/440, E31.121
See application file for complete search history.

(56) References Cited

U.S. PATENT DOCUMENTS

2007/0057339 A1* 3/2007 Mitsui et al. .................. 257/432
2009/0072337 A1* 3/2009 Lee ............................... 257/440

FOREIGN PATENT DOCUMENTS

| JP | 2006-135252 | 5/2006 |
| JP | 2006-310343 | 11/2006 |
| JP | 2007-81015 | 3/2007 |

* cited by examiner

*Primary Examiner* — Anthony J Daniels
(74) *Attorney, Agent, or Firm* — McGinn Intellectual Property Law Group, PLLC

(57) ABSTRACT

A solid-state imaging device includes a plurality of pixels and a plurality of color filters. The plurality of pixels is formed in a semiconductor substrate in a two-dimensional array arrangement. Each of the pixels has a photoelectric conversion region. The plurality of color filters is stacked on each of the pixels. The photoelectric conversion regions have the same depth irrespective of colors of the color filters stacked on the pixels. The width of a shallow portion of each of the photoelectric conversion regions is differ from a width of the deep portion of each of the photoelectric regions depending on the colors of the color filters stacked on the pixels.

4 Claims, 9 Drawing Sheets

SOLID-STATE IMAGING DEVICE, MANUFACTURING METHOD FOR SOLID-STATE IMAGING DEVICE, AND IMAGING APPARATUS

CROSS-REFERENCE TO RELATED APPLICATIONS

This application is based upon and claims priority under 35 USC 119 from Japanese Patent Application No. 2009-215607, filed Sep. 17, 2009.

BACKGROUND

1. Technical Field

The present invention relates to a solid-state imaging device such as a CMOS image sensor or a CCD image sensor, its manufacturing method, and an imaging apparatus incorporating such a solid-state imaging device.

2. Related Art

In solid-state imaging devices such as CMOS image sensors and CCD image sensors, plural pixels are arranged in a semiconductor substrate in the form of a two-dimensional array and signals that are accumulated in photoelectric conversion regions of the pixels according to reception light quantities, respectively, are read out to the outside via MOS transistors (CMOS type) or charge transfer channels (CCD type).

To take a color image of three colors (R (red), G (green), and B (blue)) without using color filters, the solid-state imaging device disclosed in JP-A-2006-135252 is configured so that each pixel can detect a color image signal of one of R, G, and B. More specifically, utilizing the fact that the distance light travels in a semiconductor substrate from its surface depends on the wavelength, photoelectric conversion regions for B light detection are formed at a shallow position, photoelectric conversion regions for R light detection are formed at a deep position, and photoelectric conversion regions for G light detection are formed at a medium position.

However, the above solid-state imaging device has a problem that since the set of photoelectric conversion regions for R light detection, the set of photoelectric conversion regions for G light detection, and the set of photoelectric conversion regions for B light detection are different from each other in depth, the characteristic of the operation of drawing unnecessary charge out of each photoelectric conversion region (vacating each photoelectric conversion region) and discarding the drawn-out charge varies between these three sets of photoelectric conversion regions.

In the solid-state imaging device disclosed in JP-A-2006-310343, although color filters are used, photoelectric conversion regions for R light detection, photoelectric conversion regions for G light detection, and photoelectric conversion regions for B light detection are still formed at different positions in the depth direction in a semiconductor substrate. Therefore, this solid-state imaging device also has the problem that the charge drawing-out characteristic varies between the three sets of photoelectric conversion regions.

In the solid-state imaging device disclosed in JP-A-2007-81015, the three sets of photoelectric conversion regions have the same depth. However, each photoelectric conversion region does not extend right vertically from the surface. Instead, a deep portion is deviated from a shallow portion to one side in the horizontal direction.

This structure weakens the incident angle dependence of the range of absorption of slant incident light. Furthermore, a uniform charge drawing-out characteristic can be obtained by virtue of the constant depth. However, the deviation direction of the deep portion of the photoelectric conversion region is not adjusted according to the color, a failure may occur in color separation to cause color contamination depending on the color filter arrangement.

Recent solid-state imaging devices have more than 10 million pixels and each pixel is miniaturized nearly to the manufacturing limit. It is therefore necessary to, for example, improve the characteristic of the operation of drawing unnecessary charge from each photoelectric conversion region and suppress color contamination.

SUMMARY OF THE INVENTION

According to an aspect of the invention, a solid-state imaging device includes a plurality of pixels and a plurality of color filters. The plurality of pixels is formed in a semiconductor substrate in a two-dimensional array arrangement. Each of the pixels has a photoelectric conversion region. The plurality of color filters is stacked on each of the pixels. The photoelectric conversion regions have the same depth irrespective of colors of the color filters stacked on the pixels. The width of a shallow portion of each of the photoelectric conversion regions is differ from a width of the deep portion of each of the photoelectric regions depending on the colors of the color filters stacked on the pixels.

DETAILED DESCRIPTION

One exemplary embodiment of the present invention will be hereinafter described with reference to the drawings.

Figure 1:
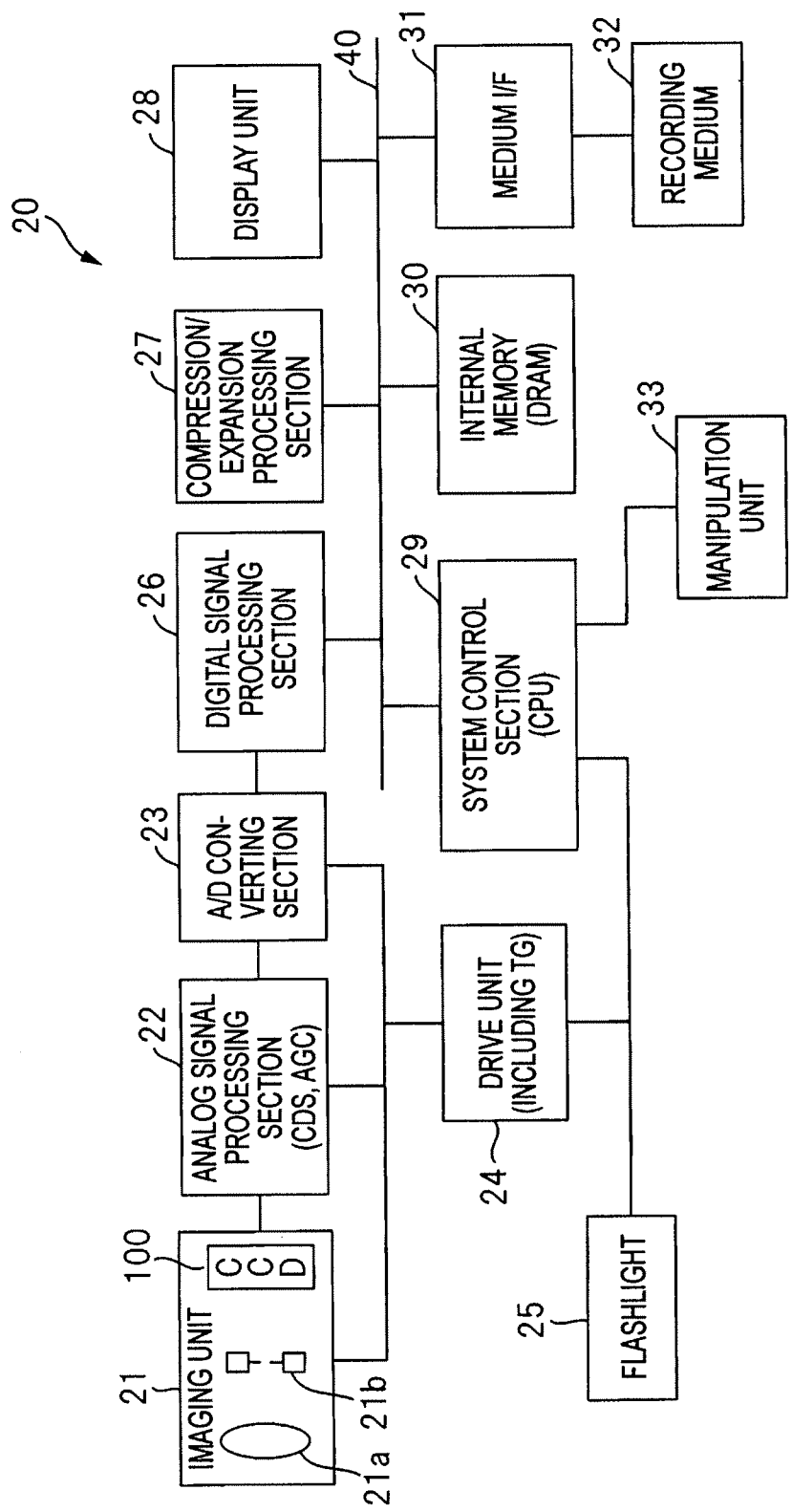
FIG. 1 is a functional block diagram of an imaging apparatus according to one exemplary embodiment of the present invention.

FIG. 1 is a functional block diagram of a digital camera (imaging apparatus) 20 according to the exemplary embodiment of the invention. The digital camera 20 is equipped with an imaging unit 21, an analog signal processing section 22 for performing analog processing such as automatic gain control (AGC) and correlated double sampling (CDS) on analog image data that is output from the imaging unit 21, an analog-to-digital (A/D) converting section 23 for converting analog image data that is output from the analog signal processing section 22 into digital image data, a drive unit 24 (including a timing generator (TG)) for drive-controlling the A/D converting section 23, the analog signal processing section 22, and the imaging unit 21 according to an instruction from a system control section (CPU; described later) 29, and a flashlight 25 for emitting light in response to an instruction from the CPU 29.

The imaging unit 21 is equipped with an optical lens system 21a for focusing light coming from a subject field, a mechanical shutter 21b which serves as a stop for reducing the aperture for light that has passed through the optical lens system 21 or is used in taking a still image, and a single solid-state imaging device 100 for color image shooting which receives light that has been focused by the optical lens system 21a and aperture-reduced by the stop and outputs shooting image data (analog image data). The solid-state imaging device 100 used in the exemplary embodiment is of the CCD type. However, it may be of the CMOS type.

The digital camera 20 according to the exemplary embodiment is further equipped with a digital signal processing section 26 for taking in the digital image data that is output from the A/D converting section 23 and performing interpolation processing, white balance correction, RGB/YC conversion, etc. on it, a compression/expansion processing section 27 for compressing received image data into JPEG or like image data or expanding received image data, a display unit 28 for displaying a menu etc. and also displaying a live view image and a shot image, the system control section (CPU) 29 for supervising the entire digital camera 20, an internal memory 30 such as a frame memory, a medium interface (I/F) 31 for performing processing for interfacing with a recording medium 32 for storing JPEG image data etc., and a bus 40 for interconnecting the above sections. A manipulation unit 33 for receiving a manipulation input from the user is connected to the system control section 29.

The manipulation unit 33 is quipped with a switch for inputting an instruction as to whether the shooting mode should be set to a still image shooting mode or a moving image shooting mode, a shutter release button, etc. The CPU 29 drive-controls the solid-state imaging device 100 via the drive unit 24 according to the content of a manipulation that is input through the manipulation unit 33.

Figure 2:
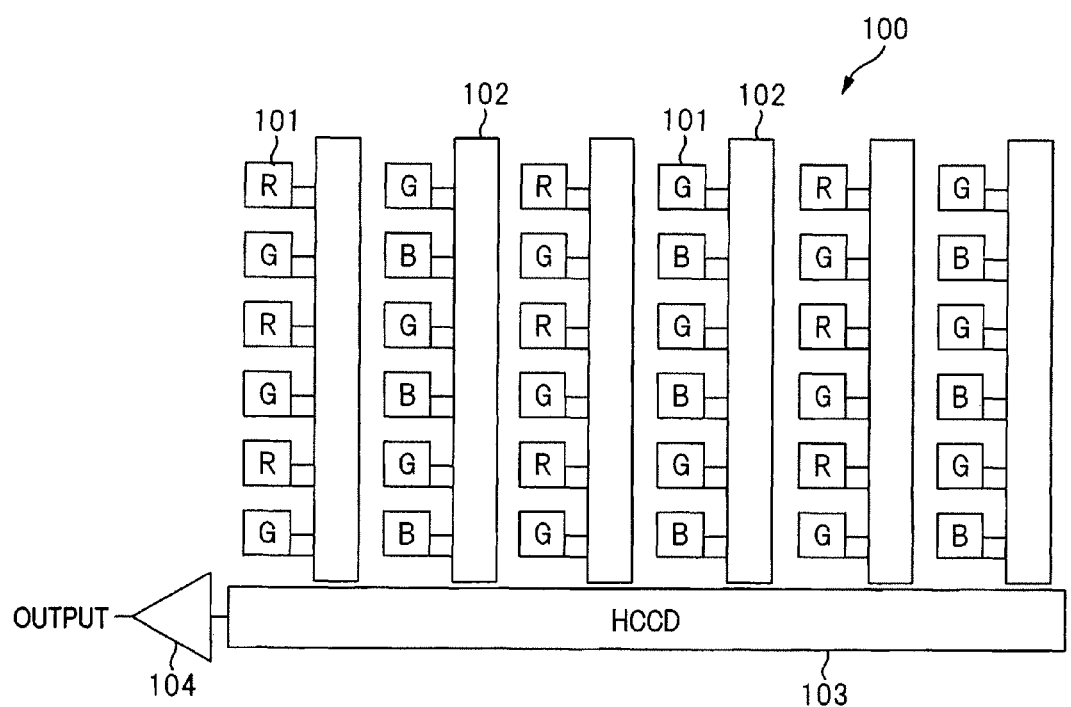
FIG. 2 is a schematic diagram of the surface of a CCD solid-state imaging device shown in FIG. 1.

FIG. 2 is a schematic diagram of the surface of the solid-state imaging device 100. The CCD solid-state imaging device 100 is provided with plural pixels 101 which are arranged in a semiconductor substrate in the form of a two-dimensional array (in FIG. 2, a square matrix), vertical charge transfer channels (VCCDs) 102 which are formed parallel with the respective pixel columns, a horizontal charge transfer channel (HCCD) which is formed parallel with the line connecting the ends, in the transfer direction, of the vertical charge transfer channels 102, and an amplifier 104 which is disposed at the output end of the horizontal charge transfer channel 103 and outputs, to the analog signal processing section 22, a voltage value signal as a shooting image signal according to the charge amount of a transferred signal charge.

In the CCD solid-state imaging device 100 shown in FIG. 2, color filters of the primary colors are Bayer-arranged over the respective pixels 101. Characters "R," "G," and "B" written in the pixels 101 represent the colors of the color filters, respectively.

Figure 3:
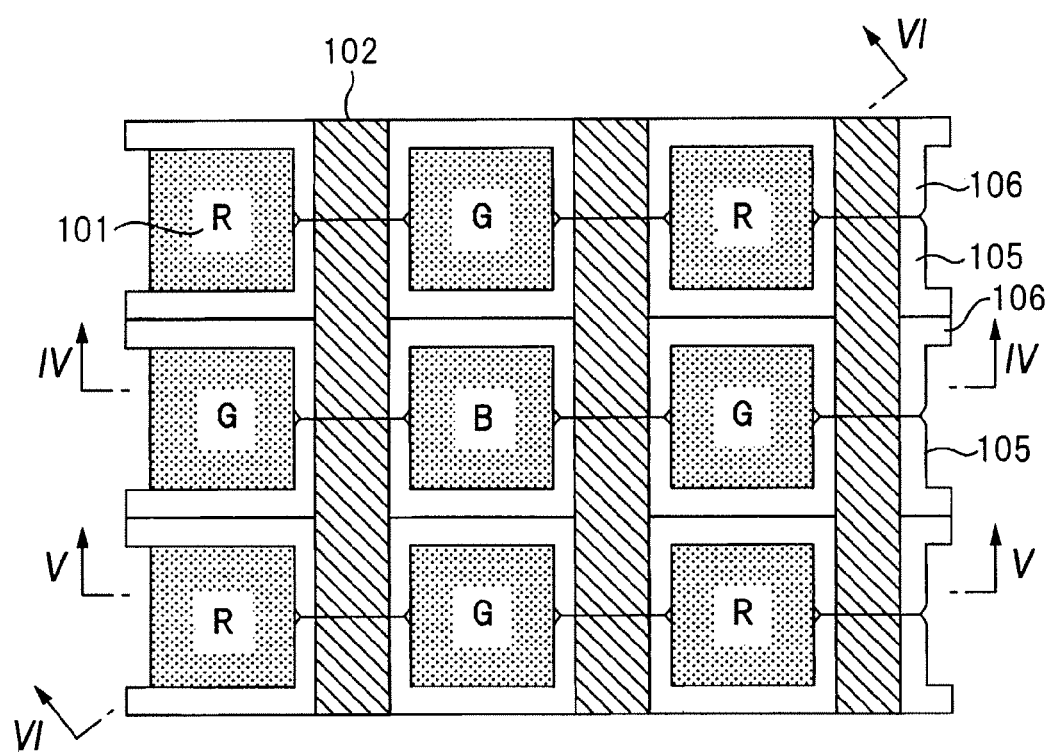
FIG. 3 is an enlarged view of a part of FIG. 2.

FIG. 3 is an enlarged view of a 3×3 pixel portion that is located at an arbitrary position in FIG. 2. A color filter of one of R, G, and B is laid on each pixel 101, and vertical charge transfer channel 102 is formed parallel with each pixel column.

Each vertical charge transfer channel 102 is composed of a buried channel (an n-type region that occupies a surface portion of a p-well region of an n-type semiconductor) formed in the semiconductor substrate and vertical transfer electrode films which are polysilicon films and are formed over the buried channel with a gate insulating film interposed in between. In the CCD solid-state imaging device 100 shown in FIG. 3, transfer electrode films 105 and 106 are formed alternately in a single layer in such a manner that a pair of transfer electrode films 105 and 106 are provided for each pixel.

In each pixel 101, a photoelectric conversion region is formed in the semiconductor substrate. A color filter layer is formed over the gate insulating film (formed on the surface of the semiconductor substrate) with a light shield film opening and a planarization layer interposed in between. A microlens (top lens) is formed over the color filter layer with a planarization layer interposed in between.

Figure 4:
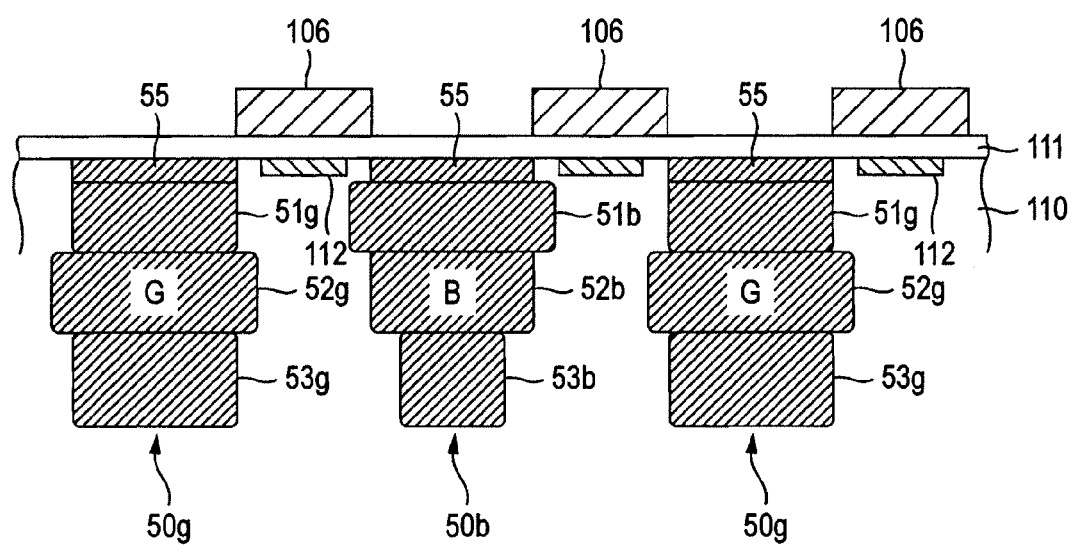
FIG. 4 is a schematic sectional view taken along line IV-IV in FIG. 3.
Figure 5:
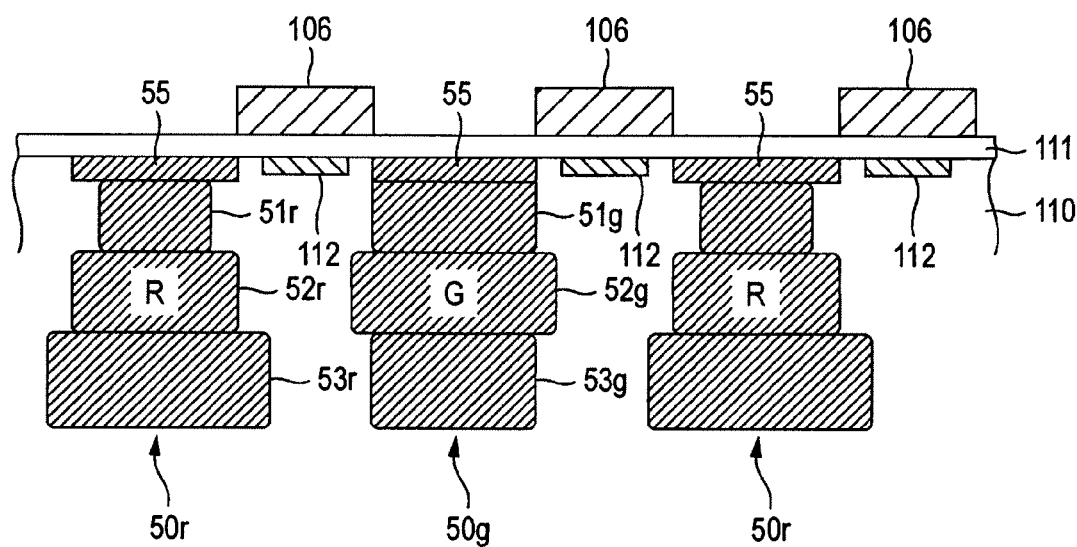
FIG. 5 is a schematic sectional view taken along line V-V in FIG. 3.

FIG. 4 is a schematic sectional view taken along line IV-IV (G pixel-B pixel-G pixel line) in FIG. 3. FIG. 5 is a schematic sectional view taken along line V-V (R pixel-G pixel-R pixel line) in FIG. 3. Fig. is a schematic sectional view taken along line VI-VI (R pixel-B pixel-R pixel line) in FIG. 3.

The gate insulating film 111 is formed on the surface of the p-well layer 110 of the semiconductor substrate. The transfer electrode films 105 and 106 of the vertical charge transfer channels 102 are formed on the gate insulating film 111. The buried channels 112 are formed under the transfer electrode films 105 and 106 with the gate insulating film 111 interposed in between.

As described above, a light shield film opening, a color filter layer, a microlens, etc. (not shown in FIGS. 4-6) are formed on each pixel 101.

A photoelectric conversion region 50r, 50g, or 50b is formed under the light shield film opening of each pixel 101. Suffixes r, g, and b indicate that the photoelectric conversion regions 50g, 50b, and 50r correspond to an R pixel (i.e., a pixel on which an R filter is laid), a G pixel (i.e., a pixel on which a G filter is laid), and a B pixel (i.e., a pixel on which a B filter is laid), respectively.

The photoelectric conversion region 50g of each G pixel has a multilayer structure (in the exemplary embodiment, a three-layer structure). That is, the photoelectric conversion region 50g consists of a shallow region 51g, an intermediate region 52g, and a deep region 53g. Likewise, the photoelectric conversion region 50b of each B pixel consists of a shallow region 51b, an intermediate region 52b, and a deep region 53b. And the photoelectric conversion region 50r of each R pixel consists of a shallow region 51r, an intermediate region 52r, and a deep region 53r.

In the exemplary embodiment, the photoelectric conversion regions 50r, 50g, and 50b have the same depth and the three regions formed in the respective layers and constituting each of the photoelectric conversion regions 50r, 50g, and 50b have approximately the same thicknesses.

A high-concentration p-type impurity surface layer 55 for preventing a white defect due to dark current is formed on the surface of the shallow region 51r, 51g, or 51b of each pixel 101.

As shown in FIG. 3, each pixel 101 is rectangular in a top view and the three regions constituting each of the photoelectric conversion regions 50g, 50b, and 50r have different top-view sizes. The three regions constituting each of the photoelectric conversion regions 50g, 50b, and 50r share the center axis and have different size in width depending on the color of light to be received. In the exemplary embodiment, three widths "large," "medium," and "small" are employed. The term "width" means a horizontal width in a side view, the length of one sideline or a diagonal of a rectangle in the top view.

More specifically, in the exemplary embodiment, the shallow region 51r, the intermediate region 52r, and the deep region 53r of each R pixel have small, medium, and large widths, respectively. In each photoelectric conversion region 50r for receiving red (R) light which goes deep into the semiconductor substrate, the deep region 53r is given the large width and the shallow region 51r is given the small width, whereby the photoelectric conversion efficiency is increased.

The shallow region 51b, the intermediate region 52b, and the deep region 53b of each B pixel have large, medium, and small widths, respectively. In each photoelectric conversion region 50b for receiving blue (B) light which travels only a short distance in the semiconductor substrate and is photoelectrically converted, in large part, in a surface portion, the shallow region 51r is given the large width and the deep region 53r is given the small width, whereby the photoelectric conversion efficiency is increased.

The shallow region 51g, the intermediate region 52g, and the deep region 53g of each G pixel have medium, large, and medium widths, respectively. In each photoelectric conversion region 50g for receiving green (G) light which travels in the semiconductor substrate a distance that is somewhere between the traveling distances of red light and blue light, the intermediate region 52g is given the large width, whereby the photoelectric conversion efficiency is increased.

As described above, in the exemplary embodiment, each of the photoelectric conversion regions 50g, 50b, and 50r consists of the three regions that exist in the respective layers and the width of each of the photoelectric conversion regions 50g, 50b, and 50r is increased and decreased locally and selectively. The three regions 51, 52, and 53 are produced by using masks having different sizes in forming the regions 51, 52, and 53 by ion implantation.

With the above structure, in the exemplary embodiment, the photoelectric conversion efficiency and hence the sensitivity can be increased for each of R light, G light, and B light. Furthermore, the degree of color contamination that is caused by slant incident light in a deep region of each of the photoelectric conversion regions 50g, 50b, and 50r is lowered, which makes it possible to produce shooting image signals that are superior in color separation and hence in quality.

As shown in FIG. 3, the photoelectric conversion regions 50g, 50b, and 50r are designed so as to have the same area in the surface of the semiconductor substrate, as a result of which no variation occurs between the dark outputs and the reading characteristics for the respective colors.

Since the photoelectric conversion regions 50g, 50b, and 50r have the same diffusion depth, the sweeping-out of excess signal charges from the substrate which is commonly performed in CCD solid-state imaging devices can be performed by applying the same voltage to the pixels of the three colors.

Figure 6:
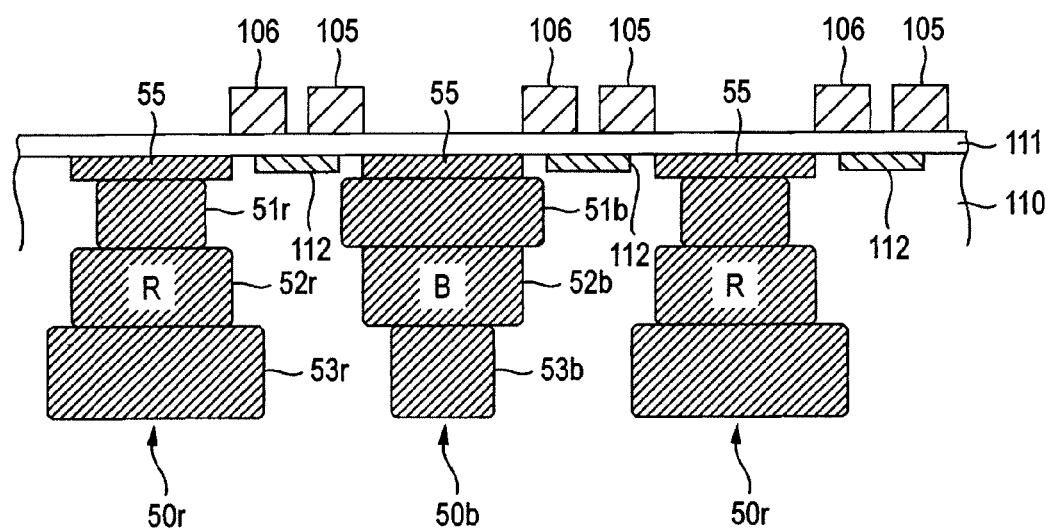
FIG. 6 is a schematic sectional view taken along line VI-VI in FIG. 3.

Furthermore, in the exemplary embodiment, as shown in FIGS. 4-6, the photoelectric conversion regions 50g, 50b, and 50r for the respective colors are formed so as to have approximately the same volumes, as a result of which the saturation outputs for the respective colors are the same and the variation between the saturation outputs for the respective colors can be reduced.

Still further, the device isolation bands between the photoelectric conversion regions 50g, 50b, and 50r have approximately the same widths, as a result of which good device isolation between the pixels of the respective colors can be attained and hence the blooming can be suppressed.

Figure 7:
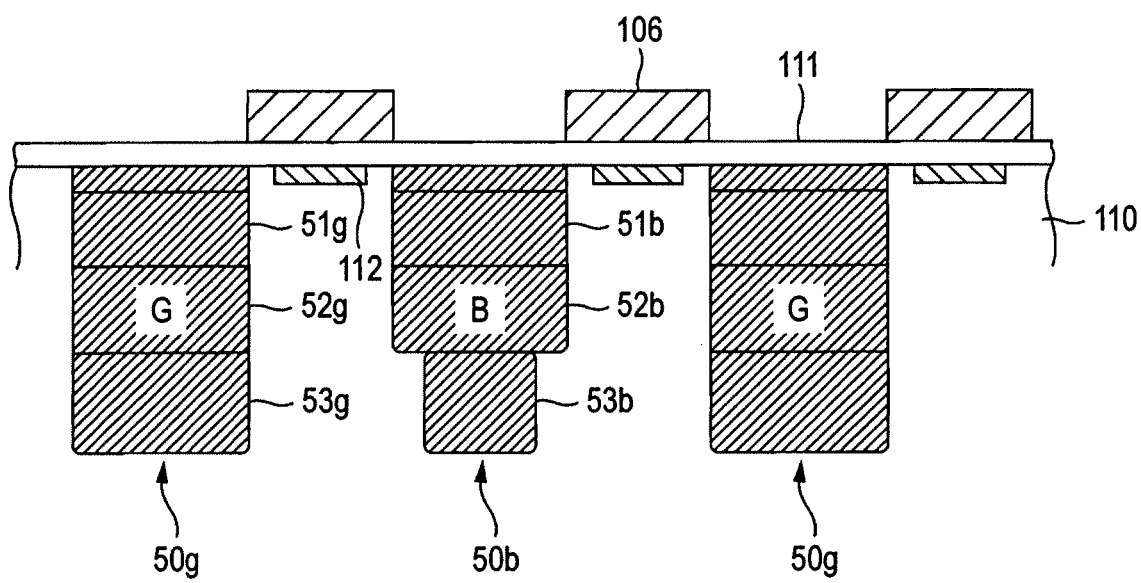
FIG. 7 is a schematic sectional view which relates to another exemplary embodiment of the invention and corresponds to FIG. 4.
Figure 8:
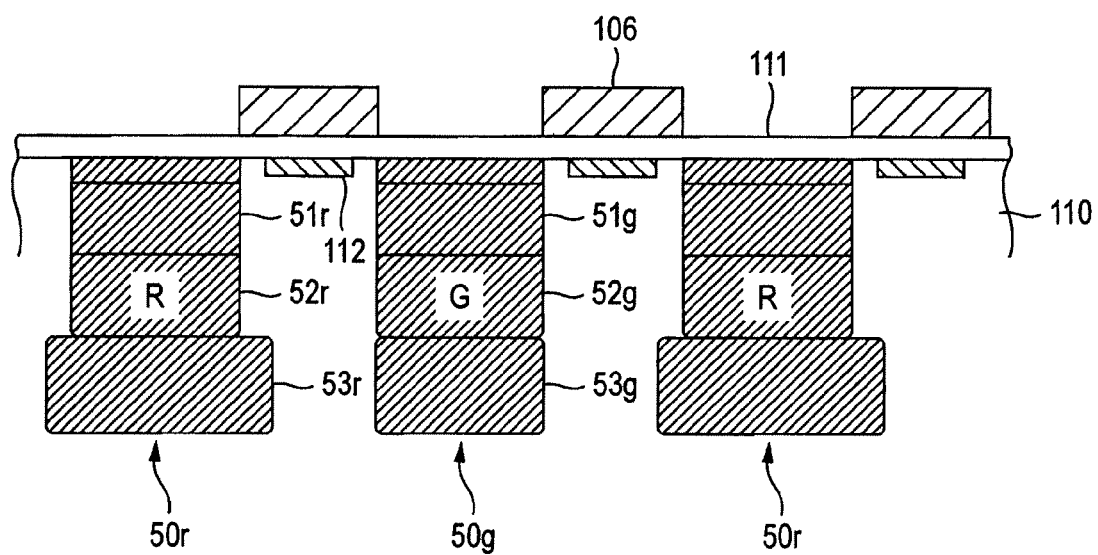
FIG. 8 is a schematic sectional view which relates to the other exemplary embodiment of the invention and corresponds to FIG. 5.
Figure 9:
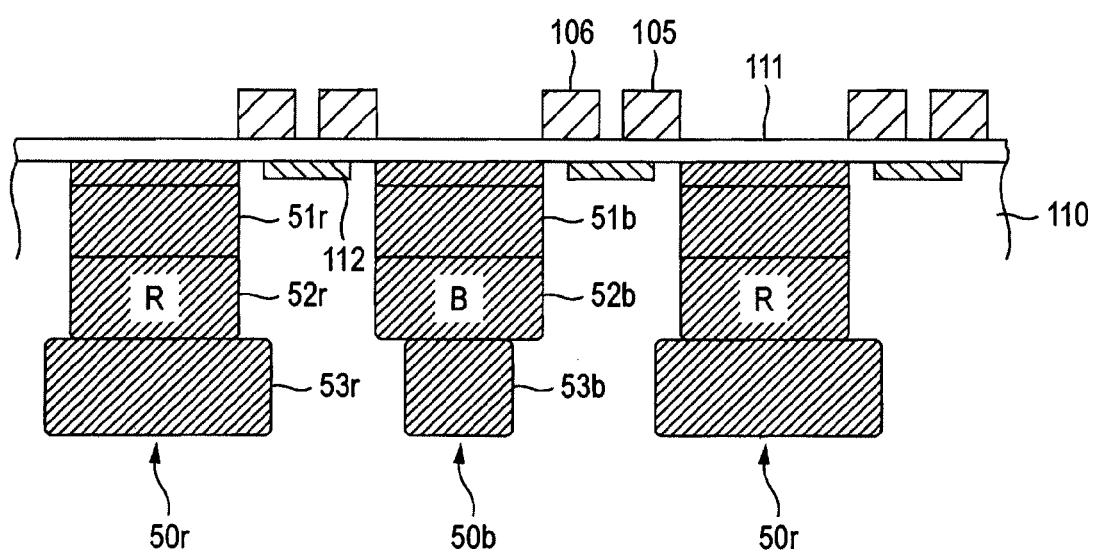
FIG. 9 is a schematic sectional view which relates to the other exemplary embodiment of the invention and corresponds to FIG. 6.

FIGS. 7-9, which are taken along line IV-IV line, line V-V, and line VI-VI in FIG. 3, respectively, show another exemplary embodiment of the invention. Whereas in the exemplary embodiment of FIGS. 4-6 each of the photoelectric conversion regions 50g, 50b, and 50r has the three-layer structure, in this exemplary embodiment each of the photoelectric conversion regions 50g, 50b, and 50r has a two-layer structure.

More specifically, in this exemplary embodiment, shallow regions 51r, 51g, and 51b and the intermediate regions 52r, 52g, and 52c for the respective colors are given the same, medium width and only deep regions 52r, 53g, and 53b for the respective colors are given different widths. In the example of FIGS. 7-9, the deep region 53r of each R pixel is given a large width, the deep region 53g of each G pixel is given a medium width, and the deep region 53b of each B pixel is given a small width.

In this exemplary embodiment, the shallow and intermediate photoelectric conversion regions can be formed by using a mask for the medium width. As a result, the same advantages as provided by the exemplary embodiment of FIGS. 4-6 can be provided while the manufacturing cost can be reduced because the number of masks to be prepared and hence the number of manufacturing steps is decreased. In particular, also in this exemplary embodiment, the deep region 53r of each R pixel is given the large width and the deep region 53b of a B pixel adjacent to the R pixel is given the small width, as a result of which color contamination involving red can be prevented. High-quality shooting image signals can thus be obtained.

As described above, the solid-state imaging device according to the exemplary embodiments has plural pixels formed in a semiconductor substrate so as to be arranged in the form of a two-dimensional array and color filters laid on the respective pixels, and is characterized in that photoelectric conversion regions of the respective pixels have the same depth irrespective of colors of the color filters, and that a shallow portion and a deep portion of each photoelectric conversion region are made different from each other in width depending on the color of the color filter laid thereon.

The solid-state imaging device according to the exemplary embodiments is further characterized in that the color filters are of primary colors, and that the deep portion of each photoelectric conversion region on which a red filter is laid is given a large width and the deep portion of each photoelectric conversion region on which a blue filter is laid is given a small width.

The solid-state imaging device according to the first exemplary embodiment is further characterized in that the color filters of primary colors, and that the width of the deep portion of each photoelectric conversion region on which a red filter is laid is larger than the width of the shallow portion thereof, the width of the shallow portion of each photoelectric conversion region on which a blue filter is laid is larger than the width of the deep portion thereof, and the width of an intermediate portion of each photoelectric conversion region on which a green filter is laid is larger than the widths of the deep portion and the shallow portion thereof.

The solid-state imaging device according to the exemplary embodiments is further characterized in that each device isolation region formed between two adjoining photoelectric conversion regions is approximately constant in width in a depth direction of the semiconductor substrate.

The manufacturing method of a solid state imaging device according to the exemplary embodiments is characterized in that variable width portions of the photoelectric conversion regions are formed by changing impurity implantation ranges of an ion implantation step for forming the photoelectric conversion regions.

The imaging apparatus according to the exemplary embodiments is characterized by comprising any of the above the solid-state imaging devices, driving means for driving the solid-state imaging device; and signal processing means for processing shooting image signals that are output from the solid-state imaging device.

According to the exemplary embodiments, since the photoelectric conversion regions for the respective colors have the same impurity diffusion depth, it is not necessary to change, for each color, the voltage that is applied to the substrate to draw out unnecessary charge and hence the charge drawing characteristic is made uniform.

Since the photoelectric conversion portion where photoelectric conversion is performed mainly is given a large width, the photoelectric conversion efficiency and hence the sensitivity is increased. Furthermore, since the interval between two adjoining photoelectric conversion regions is approximately constant in the depth direction of the semiconductor substrate, the device isolation between the pixels of the respective colors can be improved.

INDUSTRIAL APPLICABILITY

Capable of making uniform the characteristic of the operation of drawing unnecessary charge out of each color pixel and suppressing color contamination even if the pixels are miniaturized further, the solid-state imaging device according to the invention is useful when applied to digital still cameras, digital video cameras, camera-incorporated cell phones, camera-incorporated electronic apparatus, monitoring cameras, endoscopes, vehicular cameras, etc.

As described with reference to the above embodiment, there is provided a solid-state imaging device, its manufacturing method, and an imaging apparatus which can make uniform the characteristic of the operation of drawing unnecessary charge out of each color pixel and suppress color contamination even if the pixels are miniaturized further.

The embodiment makes it possible to make uniform the characteristic of the operation of drawing unnecessary charge out of each color pixel and suppress color contamination even if the pixels are miniaturized further.

What is claimed is:

1. A solid-state imaging device, comprising:
   a plurality of pixels that is formed in a semiconductor substrate in a two-dimensional array arrangement, each of the pixels comprising a photoelectric conversion region; and
   a plurality of color filters each of which is stacked on each of the pixels respectively,
   wherein the photoelectric conversion regions have a same depth irrespective of colors of the color filters stacked on the pixels,
   wherein the color filters comprise primary colors and include red filters, blue filters, and green filters,
   wherein a width of a deep portion of each of photoelectric conversion regions on which the red filters are stacked is more than a width of a shallow portion of each of photoelectric conversion regions on which the red filters are stacked,
   wherein a width of a shallow portion of each of photoelectric conversion regions on which the blue filters are stacked is more than a width of the deep portion of each of photoelectric conversion regions on which the blue filters are stacked, and
   wherein a width of a portion between the deep portion and a shallow portion of each of photoelectric conversion regions on which the green filters are stacked is more than a width of the deep portion and the shallow portion of each of photoelectric conversion regions on which the green filters are stacked.

2. The solid-state imaging device according to claim 1, wherein the width of the deep portion of each of the photoelectric conversion regions on which the red filters are stacked is more than the width of the deep portion of each of the photoelectric conversion regions on which the blue filters are stacked.

3. The solid-state imaging device according to claim 1, wherein a width of a device isolation region formed between a first photoelectric conversion region of the photoelectric conversion regions and a second photoelectric conversion region of the photoelectric conversion regions is approximately constant in a depth direction of the semiconductor substrate, the first photoelectric conversion region being adjacent to the second photoelectric conversion region.

4. An imaging apparatus, comprising:
   a solid-state imaging device that includes:
      a plurality of pixels that is formed in a semiconductor substrate in a two-dimensional array state, each of the pixels comprising a photoelectric conversion region; and
      a plurality of color filters that is stacked on each of the pixels,
      wherein the photoelectric conversion regions have a same depth irrespective of colors of the color filters stacked on the pixels,
      wherein the color filters comprise primary colors and include red filters, blue filters, and green filters,
      wherein a width of a deep portion of each of photoelectric conversion regions on which the red filters are stacked is more than a width of a shallow portion of each of photoelectric conversion regions on which the red filters are stacked,
      wherein a width of a shallow portion of each of photoelectric conversion regions on which the blue filters are stacked is more than a width of the deep portion of each of photoelectric conversion regions on which the blue filters are stacked, and
      wherein a width of a portion between the deep portion and a shallow portion of each of photoelectric conversion regions on which the green filters are stacked is more than a width of the deep portion and the shallow portion of each of photoelectric conversion regions on which the green filters are stacked,
   a driving unit that drives the solid-state imaging device; and
   a signal processing unit that processes shooting image signals that are output from the solid-state imaging device.

* * * * *